(12) United States Patent
Wu et al.

(10) Patent No.: US 9,848,508 B1
(45) Date of Patent: Dec. 19, 2017

(54) COOLING SYSTEMS AND SYNTHETIC JETS CONFIGURED TO HARVEST ENERGY AND VEHICLES INCLUDING THE SAME

(71) Applicant: Toyota Motor Engineering & Manufacturing North America, Inc., Erlanger, KY (US)

(72) Inventors: Songtao Wu, Ann Arbor, MI (US); Shailesh Joshi, Ann Arbor, MI (US); Debasish Banerjee, Ann Arbor, MI (US)

(73) Assignee: TOYOTA MOTOR ENGINEERING & MANUFACTURING NORTH AMERICA, INC., Erlanger, KY (US)

( * ) Notice: Subject to any disclaimer, the term of this patent is extended or adjusted under 35 U.S.C. 154(b) by 0 days.

(21) Appl. No.: 15/185,912

(22) Filed: Jun. 17, 2016

(51) Int. Cl.
*H05K 7/20* (2006.01)

(52) U.S. Cl.
CPC ..... *H05K 7/20218* (2013.01); *H05K 7/20009* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 6,707,236 B2 | 3/2004 | Pelrine et al. | |
| 8,426,999 B2 | 4/2013 | Drevet | |
| 8,929,074 B2 | 1/2015 | Joshi et al. | |
| 2002/0050148 A1* | 5/2002 | Shyy | F04B 43/043 62/498 |
| 2003/0081397 A1* | 5/2003 | Potter | H02N 1/08 361/807 |

(Continued)

FOREIGN PATENT DOCUMENTS

CN 104320018 A 1/2015

OTHER PUBLICATIONS

Mane, Poorna, Integrated actuation and energy harvesting in prestressed piezoelectric synthetic jets, http://scholarscompass.vcu.edu/cgi/viewcontent.cgi?article=2902&context=etd, published Aug. 7, 2009.

(Continued)

*Primary Examiner* — Anthony Haughton
*Assistant Examiner* — Razmeen Gafur
(74) *Attorney, Agent, or Firm* — Dinsmore & Shohl LLP

(57) ABSTRACT

A cooling system includes a diaphragm, at least one conductor layer disposed on the diaphragm, at least one dielectric film layer, and a controller. The controller is programmed to operate the cooling system in a contact mode and in a non-contact mode. In the contact mode, the diaphragm is controlled to oscillate at a first amplitude such that the conductor layer contacts the dielectric film layer. In the non-contact mode, the diaphragm is controlled to oscillate at a second amplitude such that the conductor layer does not contact the dielectric film layer while the diaphragm oscillates.

20 Claims, 6 Drawing Sheets

(56) References Cited

U.S. PATENT DOCUMENTS

| | | | |
|---|---|---|---|
| 2004/0139598 A1* | 7/2004 | Berryman | H01C 7/003 29/831 |
| 2005/0072559 A1* | 4/2005 | Ippoushi | F28D 15/0233 165/104.13 |
| 2005/0111185 A1* | 5/2005 | Bhattacharya | H05K 7/20009 361/690 |
| 2005/0151555 A1* | 7/2005 | Lewis | F25B 9/145 361/676 |
| 2006/0185822 A1* | 8/2006 | Glezer | F04F 7/00 165/80.3 |
| 2007/0034360 A1* | 2/2007 | Hall | G06F 1/183 165/104.33 |
| 2007/0119575 A1* | 5/2007 | Glezer | H01L 23/427 165/104.33 |
| 2008/0043061 A1* | 2/2008 | Glezer | H02K 33/18 347/53 |
| 2008/0192430 A1* | 8/2008 | Brandenburg | H01L 23/467 361/695 |
| 2009/0050294 A1* | 2/2009 | Fedorov | G06F 1/20 165/80.3 |
| 2009/0074595 A1* | 3/2009 | Chen | F04B 19/006 417/413.2 |
| 2009/0146292 A1* | 6/2009 | Drake | H01L 23/3733 257/712 |
| 2009/0302461 A1* | 12/2009 | Winter | H01L 23/34 257/713 |
| 2009/0321044 A1* | 12/2009 | Hernon | H01L 23/34 165/80.2 |
| 2010/0032150 A1* | 2/2010 | Determan | F28D 15/0266 165/246 |
| 2010/0053891 A1* | 3/2010 | Arik | H01L 23/467 361/692 |
| 2010/0296248 A1* | 11/2010 | Campbell | H05K 7/20218 361/699 |
| 2011/0141691 A1* | 6/2011 | Slaton | H05K 7/20145 361/690 |
| 2012/0050989 A1* | 3/2012 | Bhagavat | H01L 23/467 361/694 |
| 2012/0229738 A1* | 9/2012 | Toyama | G02F 1/133528 349/97 |
| 2013/0188307 A1* | 7/2013 | Mahalingam | F28F 13/02 361/679.46 |
| 2014/0034270 A1* | 2/2014 | de Bock | H05K 7/20172 165/80.3 |
| 2014/0043764 A1* | 2/2014 | Weaver | B23P 15/26 361/699 |
| 2014/0049970 A1* | 2/2014 | de Bock | H01L 41/0926 362/373 |
| 2014/0083670 A1* | 3/2014 | Zonenberg | F04B 19/006 165/185 |
| 2014/0084748 A1 | 3/2014 | Wang et al. | |
| 2014/0246950 A1 | 9/2014 | Wang et al. | |
| 2014/0246951 A1 | 9/2014 | Wang et al. | |
| 2014/0321053 A1* | 10/2014 | Donnelly | H05K 7/20236 361/691 |
| 2014/0338458 A1 | 11/2014 | Wang et al. | |
| 2014/0342201 A1* | 11/2014 | Andres | H01M 10/5093 429/62 |
| 2015/0021410 A1* | 1/2015 | Arik | H01L 23/467 239/75 |
| 2015/0061464 A1 | 3/2015 | Park et al. | |
| 2016/0040648 A1 | 2/2016 | Wang et al. | |

OTHER PUBLICATIONS

Mengdi et al., Wafer-level fabrication of a triboelectric energy harvester, https://www.deepdyve.com/lp/institute-of-electrical-and-electronics-engineers/wafer-level-fabrication-of-a-triboelectric-energy-harvester-Uj8uvYug0s, published Jan. 22, 2015.

* cited by examiner

COOLING SYSTEMS AND SYNTHETIC JETS CONFIGURED TO HARVEST ENERGY AND VEHICLES INCLUDING THE SAME

TECHNICAL FIELD

The present specification generally relates to cooling systems and, more particularly, to cooling systems that employ triboelectric devices for energy generation.

BACKGROUND

Power electronics devices are often utilized in high-power electrical applications, such as inverter systems for hybrid electric vehicles and electric vehicles. Power semiconductor devices, such as insulated gate bipolar transistors (IGBTs) and power transistors, for example, may be thermally coupled to a cooling device (e.g., a heat spreader and/or a heat sink), to remove non-uniform heat fluxes generated by the power semiconductor devices. Operation of the power semiconductor devices may generate high thermal loads. Power semiconductor devices are demanding increased thermal management performance of cooling devices.

In some cooling devices, a cooling fluid may be used to receive heat from a heat generating device, such as a power semiconductor device, through convective heat transfer and remove the heat from the heat generating device. For example, one device that may be utilized to cool a power semi-conductor device is a synthetic jet device. Generally, a synthetic jet device utilizes an oscillating diaphragm to create an airflow to cool a device. However, the synthetic jet device may generate kinetic energy that is wasted.

Accordingly, a need exists for alternative cooling systems for electronic device assemblies that harvest kinetic energy.

SUMMARY

In one embodiment, a cooling system includes a diaphragm, at least one conductor layer disposed on the diaphragm, at least one dielectric film layer, and a controller. The controller is programmed to operate the cooling system in a contact mode and in a non-contact mode. In the contact mode, the diaphragm is controlled to oscillate at a first amplitude such that the conductor layer contacts the dielectric film layer. In the non-contact mode, the diaphragm is controlled to oscillate at a second amplitude such that the conductor layer does not contact the dielectric film layer while the diaphragm oscillates.

In another embodiment, a synthetic jet device includes a diaphragm, at least one conductor layer disposed on the diaphragm, at least one dielectric film layer, and a controller. The controller is programmed to operate the synthetic jet device in a contact mode and in a non-contact mode. In the contact mode, the diaphragm is controlled to oscillate at a first amplitude such that the conductor layer contacts the dielectric film layer. In the non-contact mode, the diaphragm is controlled to oscillate at a second amplitude such that the conductor layer does not contact the dielectric film layer while the diaphragm oscillates. The oscillation of the diaphragm generates a fluid jet.

In yet another embodiment, a vehicle includes an electric motor; and a synthetic jet device electrically coupled to the electric motor. The synthetic jet device includes a diaphragm; at least one conductor layer disposed on the diaphragm; at least one dielectric film layer; and a controller. The controller is programmed to operate the synthetic jet device in a contact mode to operate the synthetic jet device in a non-contact mode. In the contact mode, the diaphragm is controlled to oscillate at a first amplitude such that the at least one conductor layer contacts the at least one dielectric film layer. In the non-contact mode, the diaphragm is controlled to oscillate at a second amplitude such that the at least one conductor layer does not contact the at least one dielectric film layer while the diaphragm oscillates.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of the present disclosure are directed to cooling systems including a diaphragm that are operable to harvest electrical energy from the kinetic energy of the oscillating diaphragm. Particularly, embodiments described herein include a diaphragm and a controller programmed to operate the cooling system in a contact mode and a non-contact mode. For example, the controller may be programmed to operate the cooling system in a contact mode in which the diaphragm is controlled to oscillate at a first amplitude such that a conductor layer disposed on the diaphragm contacts a dielectric film layer. In the non-contact mode, the diaphragm is controlled to oscillate at a second amplitude such that the conductor layer does not contact the dielectric film layer when the diaphragm oscillates. As the diaphragm oscillates, energy produced as a result of the triboelectric effect and electrostatic induction between the conductor layer and a dielectric film may be harvested. The harvested energy may be used, for example, to power the cooling system or another electronic device, or may be stored for later use. As an example and not a limitation, the power output may be about 1.5 W/m² when the device operates in non-contact mode and about 2 W/m² when the device operates in contact mode. Various embodiments of cooling systems including triboelectric devices and vehicles incorporating the same are described in detail below.

Figure 1:
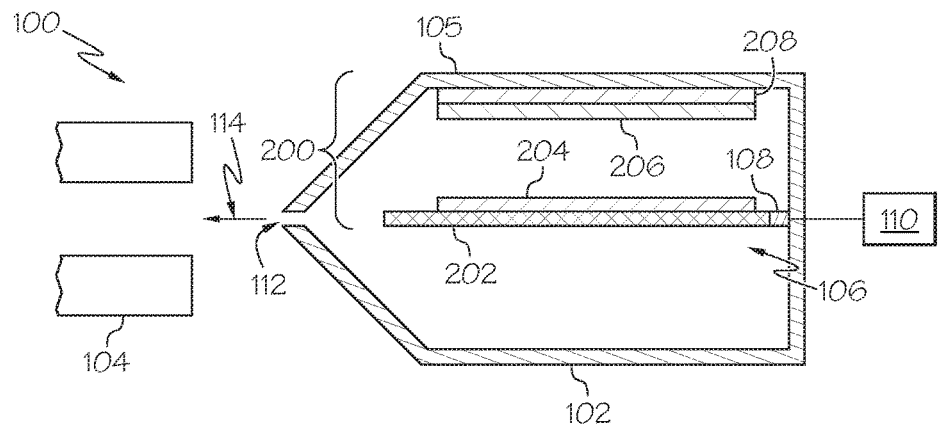
FIG. 1 schematically depicts an example cooling system including an oscillating diaphragm according to one or more embodiments described and illustrated herein.

FIG. 1 depicts an example cooling system 100. In general, the cooling system 100 includes a synthetic jet device 102 and one or more heat generating elements 104. The synthetic jet device 102 includes a diaphragm 202 between walls 105 of the synthetic jet device 102 that define a fluid housing. In particular, the walls 105 are spaced apart to define cavity 106 in which the diaphragm 202 is positioned.

The diaphragm 202 may be formed from a metal, plastic, glass ceramic, elastomeric material, or any other suitable material. Suitable metals include materials such as nickel, aluminum, copper and molybdenum, and alloys such as stainless steel, brass, or the like. Suitable elastomeric materials include, by way of example and not limitation, silicones, rubbers, urethanes, elastic polymers, and the like.

In various embodiments, the diaphragm 202 is coupled to an actuator 108 to enable displacement of the diaphragm 202 within the cavity 106. The actuator 108 may be, for example, a piezoelectric actuator, an electric actuator, an ultrasonic actuator, an electro-restrictive actuator, a pneumatic actuator, or a magnetic actuator. As shown in FIG. 1, the actuator 108 is driven by a controller 110.

The controller 110 may be configured as any processing or computing device capable of receiving one or more signals and producing one or more output signals to operate the cooling system 100, and more specifically, the synthetic jet device 102. Example processing or computing devices for the controller 110 include, but are not limited to, programmable logic controllers, analog to digital converter devices, digital to analog converter devices, general purpose microcontrollers, application specific integrated circuits, discrete electronic components, and general purpose computing devices. The functionality of the controller 110 may be provided by any combination of software, hardware and firmware. In some embodiments, the controller 110 may include a non-transitory computer-readable medium storing instructions to receive the one or more signals and produce the one or more output signals.

The controller 110 is operable to operate the synthetic jet device 102 in a contact mode and in a non-contact mode. More particularly, the controller 110 is programmed to oscillate the diaphragm 202, such as through the actuator 108, at a first amplitude corresponding to the contact mode and a second amplitude corresponding to the non-contact mode. The controller 110, and its use to operate the synthetic jet device 102, will be discussed in greater detail hereinbelow.

In operation, the controller 110 drives the actuator 108 to oscillate the diaphragm 202 within the cavity 106 of the synthetic jet device 102. As the diaphragm 202 oscillates within the cavity 106, it displaces fluid in the cavity 106, which is expelled from the synthetic jet device 102 through a nozzle 112 to form a fluid jet 114. The fluid may be air, another gas, or even a liquid. The fluid jet 114 passes over the heat generating elements 104. Through convection, the fluid jet 114 facilitates a reduction of the temperature of the heat generating elements 104.

In various embodiments, energy resulting from the oscillation of the diaphragm 202 within the cavity 106 may be harvested, such as through the use of a capacitor or battery. Accordingly, in various embodiments, the diaphragm 202 and at least one of the walls 105 of the synthetic jet device 102 form a triboelectric device 200.

Figure 2:
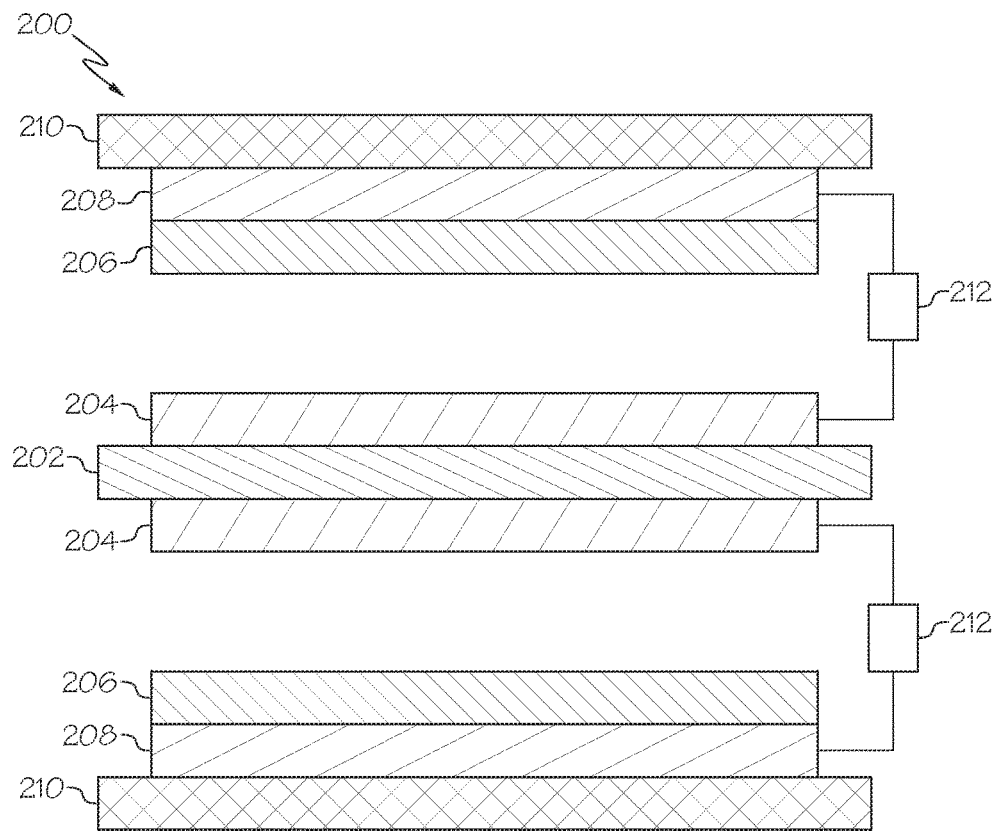
FIG. 2 schematically depicts an example triboelectric device for use in the cooling system of FIG. 1 according to one or more embodiments described and illustrated herein.

FIG. 2 schematically illustrates an example triboelectric device 200 in accordance with various embodiments described herein. As shown in FIG. 2, the triboelectric device 200 generally includes the diaphragm 202, at least one conductor layer 204 disposed on the diaphragm 202, and at least one dielectric film layer 206. In the embodiment depicted in FIG. 2, the dielectric film layer 206 is disposed on a second conductor layer 208 which is, in turn, disposed on a cover 210. In various embodiments, the cover 210 may be a part of the synthetic jet device 102, such as the wall 105. Although the embodiment in FIG. 2 is depicted as including conductor layers 204 on opposing surfaces of the diaphragm 202, it should be understood that in some embodiments, such as the embodiment depicted in FIG. 1, a conductor layer 204 may be disposed on a single surface of the diaphragm 202.

The conductor layer 204 and the second conductor layer 208 serve as electrodes. Accordingly, the conductor layers 208, 208 may be made of aluminum, copper, gold, or another conductive material having a triboelectric series rating indicating a propensity to lose electrons. The conductor layers 204, 208 may be, for example, a thin film of a conductive material. Some suitable materials for the conductor layers 204, 208 include, by way of example and not limitation, gold thin films and aluminum foil. In various embodiments, each conductor layer 204, 208 is made of a material that is at a different position on a triboelectric series than the dielectric film layer 206. Moreover, the conductor layer 204 may be the same material or a different material as the material of the second conductor layer 208.

The dielectric film layer 206 may be made of one or more polymeric materials or another material with a triboelectric series rating indicating a propensity to gain electrons. The dielectric film layer 206 may be, by way of example and not limitation, polyvinyl chloride (PVC), polyimide, a polymeric organosilicon compound, such as polydimethylsiloxane (PDMS), or a fluorinated ethylene polymer, such as fluorinated ethylene propylene (FEP), polytetrafluoroethylene (PTFE), and the like. Although depicted in FIG. 2 as being disposed on the conductor layer 208, it is contemplated that in some embodiments, the dielectric film layer 206 may be disposed on the conductor layer 204 rather than the second conductor layer 208.

FIG. 2 also depicts a load 212 coupling the conductor layer 204 to the second conductor layer 208. The load 212 may be, by way of example and not limitation, any component suitable to consume or store electric power generated between the conductor layer 204 and the second conductor layer 208. As non-limiting examples, the load 212 may be a capacitor, a powered electronic device, such as a sensor or a light-emitting diode (LED), or even a component of the cooling system 100, such as the controller 110. In embodiments in which the cooling system 100 consumes the power generated between the conductor layers 204 and 208, the cooling system 100 may be referred to as a self-powered cooling system. In order to generate electricity, the controller 110 is programmed to operate the synthetic jet device 102 in a contact mode and in a non-contact mode, which will be discussed in turn.

Figure 3A:
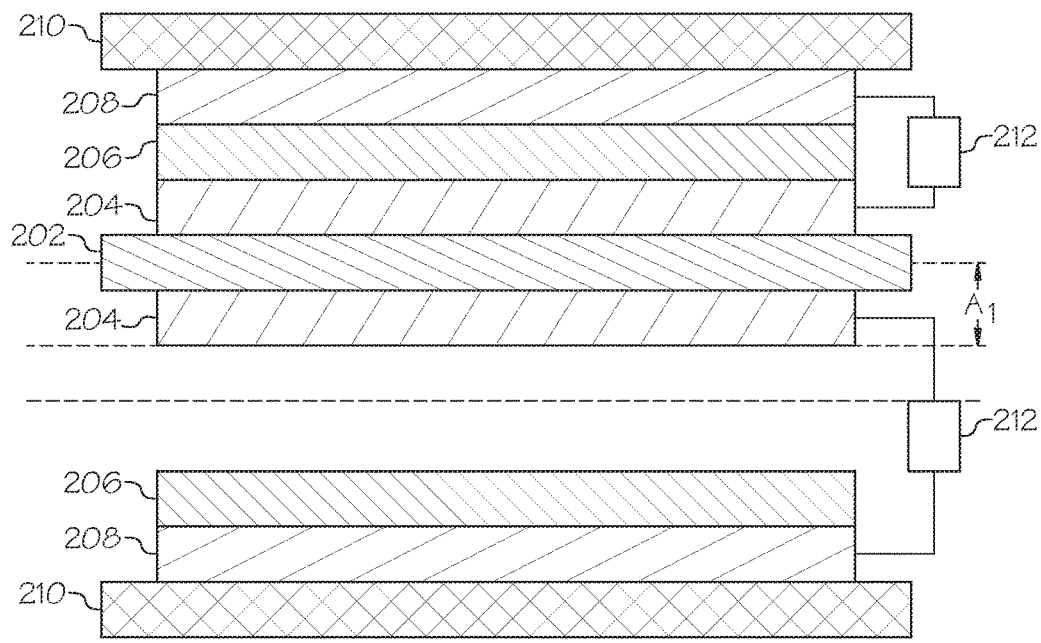
FIGS. 3A and 3B schematically depict an example triboelectric device operating in contact mode according to one or more embodiments described and illustrated herein.
Figure 3B:
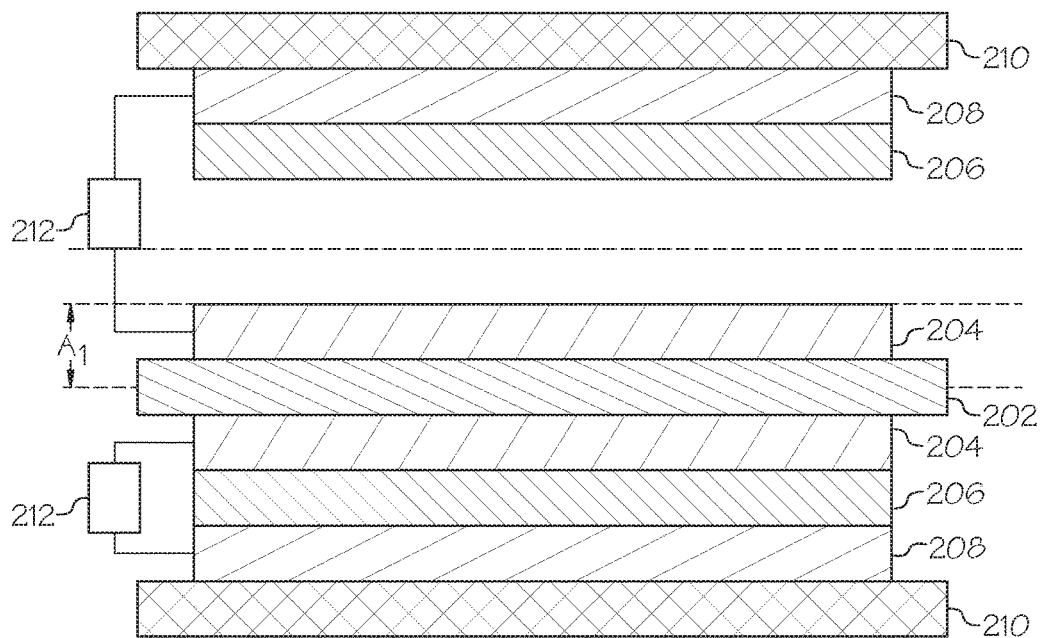

When the controller 110 operates the synthetic jet device 102 in contact mode, the diaphragm 202 is controlled to oscillate at a first amplitude $A_1$ such that the conductor layer 204 contacts the dielectric film layer 206, as shown in FIGS. 3A and 3B. In various embodiments, as a non-limiting example, the first amplitude $A_1$ is between about 1 mm and about 5 mm, depending on the space between the conductor layer 204 and the dielectric film layer 206 and the thickness of the conductor layer 204 and the diaphragm 202. Without being bound by theory, when the conductor layer 204 contacts the dielectric film layer 206, the triboelectric effect causes electrons to be transferred from the surface of the conductor layer 204 to the dielectric film layer 206, thereby causing a net negative charge in the dielectric film layer 206 and a net positive charge in the conductor layer 204. As a result of the net positive charge in the conductor layer 204, electrons flow from the conductor layer 208 to the conductor layer 204 through the load 212.

The electric field generated by the separated surface charges between the conductor layer 204 and the dielectric film layer 206 will then give rise to a much higher potential on the conductor layer 204 than on the second conductor layer 208. Such a potential difference will drive the flow of positive charges from the conductor layer 204 to the second conductor layer 208 through the load 212 until the potential difference is fully offset by the transferred charges. As a non-limiting example, the synthetic jet device 102 generates energy in an amount of between about 1.0 W/m$^2$ and about 3.0 W/m$^2$, between about 1.5 W/m$^2$ and about 2.5 W/m$^2$, or between about 1.75 W/m$^2$ and about 2.25 W/m$^2$ when operated in contact mode. In another non-limiting example, the synthetic jet device 102 generates about 2 W/m$^2$ in contact mode.

Figure 4A:
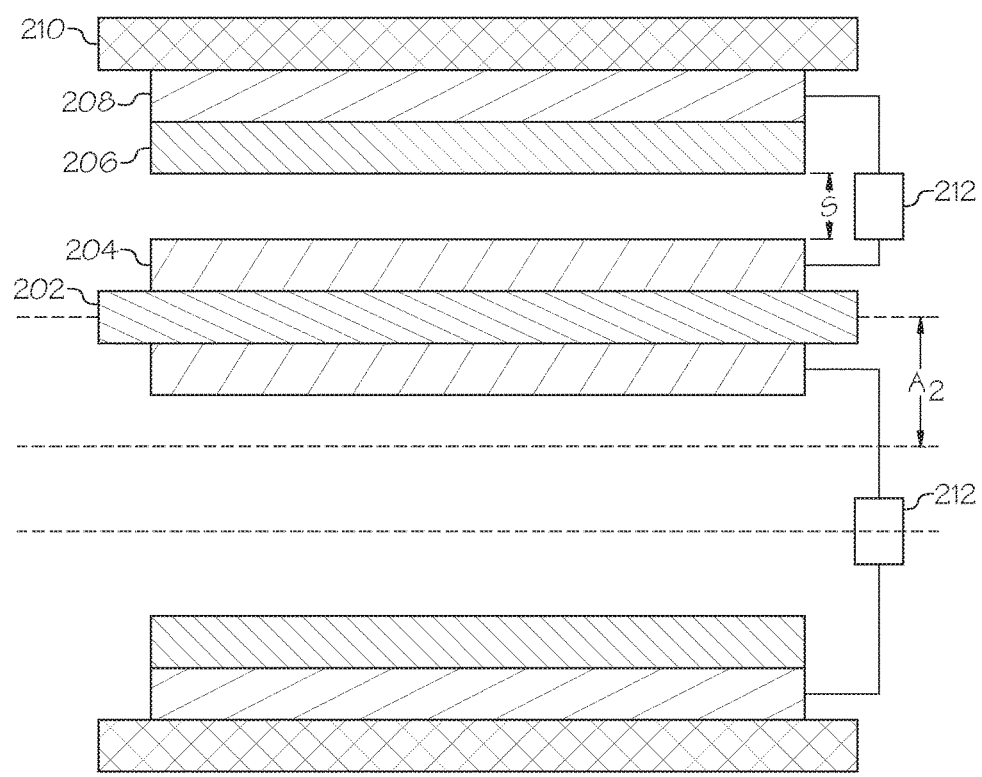
FIGS. 4A and 4B schematically depict an example triboelectric device operating in non-contact mode according to one or more embodiments described and illustrated herein.
Figure 4B:
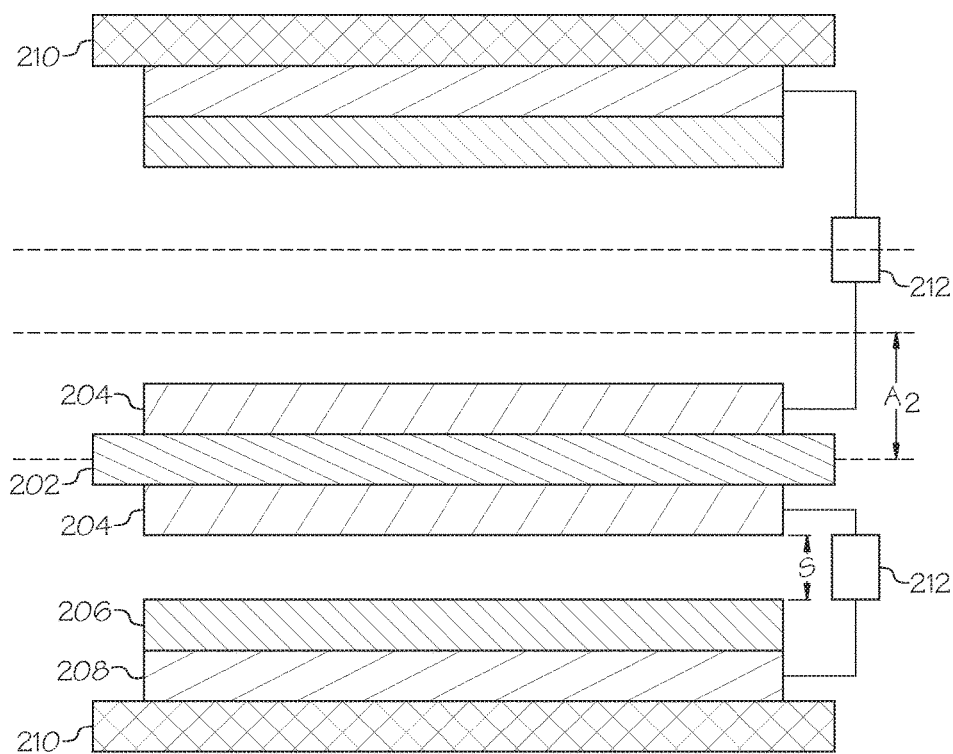

FIGS. 4A and 4B schematically illustrate operation of the synthetic jet device 102 in non-contact mode. When the controller 110 operates the synthetic jet device 102 in non-contact mode, the diaphragm 202 is controlled to oscillate at a second amplitude $A_2$ such that the conductor layer 204 does not contact the dielectric film layer 206 while the diaphragm 202 oscillates. As shown in FIGS. 4A and 4B, when the diaphragm 202 is oscillated at amplitude $A_2$, the conductor layer 204 is spaced apart from the dielectric film layer 206 by a distance s. As a non-limiting example, the second amplitude $A_2$ is between about 0.5 mm and about 4.5 mm, between about 1 mm and about 4.25 mm, or between about 2 mm and about 4 mm. The distance s may, in some embodiments, be between about 0.05 mm and about 2 mm. The second amplitude $A_2$ is less than the first amplitude $A_1$ and greater than zero (i.e., $A_1 > A_2 > 0$). Without being bound by theory, when the conductor layer 204 is brought into close proximity to (but not contact with) the dielectric film layer 206, the electrostatic field between the conductor layer 204 (which has a net positive charge) and the dielectric film layer 206 (which has a net negative charge) causes the dielectric film layer 206 to become slightly polarized, which drives the flow of positive charges from the conductor layer 204 to the second conductor layer 208 through the load 212.

As non-limiting examples, the synthetic jet device 102 generates energy in an amount of between about 0.5 W/m$^2$ and about 2.5 W/m$^2$, between about 1.0 W/m$^2$ and about 2.0 W/m$^2$, or between about 1.25 W/m$^2$ and about 1.75 W/m$^2$ when operated in non-contact mode. In one particular embodiment, the synthetic jet device 102 generates about 1.5 W/m$^2$ in non-contact mode.

In operation, the controller 110 is programmed to operate the synthetic jet device 102 in a non-contact mode for a number of cycles following operation of the synthetic jet device 102 in a contact mode for a predetermined number of cycles. For example, the controller 110 may operate the synthetic jet device 102 in a contact mode for one or more cycles, which brings the conductor layer 204 and the dielectric film layer 206 into contact with one another, producing triboelectric charges through the transfer of electrons. The predetermined number of cycles for operation of the cooling system 100 may be any number such as, without limitation, 5 cycles, 3 cycles, or even one cycle.

In one particular embodiment, the charge imbalance resulting from one cycle of the synthetic jet device 102 in contact mode yields an initial charge imbalance between the conductor layer 204 and the dielectric film layer 206. As used herein, the "initial charge imbalance" is the charge imbalance that results from the transfer of electrons from the conductor layer 204 to the dielectric film layer 206 when the two layers contact one another when the synthetic jet device 102 is operated in contact mode. In some embodiments, the initial charge imbalance is achieved as a result of a single contact between the conductor layer 204 and the dielectric film layer 206 and is a value corresponding to the charge imbalance resulting from separation of the conductor layer 204 from the dielectric film layer 206. In other embodiments, when the synthetic jet device 102 is operated in contact mode for more than one cycle in a row, the "initial charge imbalance" is the maximum charge imbalance that results during operation in contact mode. For example, the charge imbalance may increase with each contact to a maximum charge imbalance before the synthetic jet device 102 is operated in non-contact mode. The maximum charge imbalance corresponds to the initial charge imbalance for the system. Accordingly, in various embodiments, the controller 110 is programmed to operate the synthetic jet device 102 in contact mode effective to increase an existing charge balance between the conductor layer 204 and the dielectric layer 206 to the initial charge imbalance.

As non-limiting examples, the initial charge imbalance may be between about 10 µC/m$^2$ and about 100 µC/m$^2$, between about 25 µC/m$^2$ and about 75 µC/m$^2$, or between about 40 µC/m$^2$ and about 60 µC/m$^2$. In one particular embodiment, the initial charge imbalance is about 50 µC/m$^2$.

After operating in the contact mode for the predetermined number of cycles, the controller 110 may be programmed to then switch the synthetic jet device 102 to operation in a non-contact mode. The controller 110 may be programmed to operate the synthetic jet device 102 in non-contact mode for more than one cycle before operating the synthetic jet device 102 in contact mode again.

In some embodiments, the controller 110 is programmed to operate the synthetic jet device 102 in contact mode responsive to determining that the existing charge imbalance between the conductor layer 204 and the dielectric film layer 206 is below a threshold charge imbalance. The threshold charge imbalance may be, by way of example and not limitation, about 75% of the initial charge imbalance, about 60% of the initial charge imbalance, about 50% of the initial charge imbalance, or even about 40% of the initial charge imbalance. Accordingly, the controller 110 may receive charge imbalance information, compare the received charge imbalance information corresponding to an existing charge imbalance to a threshold charge imbalance stored in the memory of the controller 110, and, when the existing charge imbalance is below the threshold charge imbalance, operate the synthetic jet device 102 in contact mode. For example, in one non-limiting example, the controller 110 may measure the voltage across the load to obtain the charge imbalance information. However, it is contemplated that the controller 110 may be configured to receive charge imbalance information in any suitable way.

In some other embodiments, the controller 110 may be programmed to operate the synthetic jet device 102 in contact mode responsive to determining that a predetermined amount of time has passed since the synthetic jet device 102 was last operated in contact mode. For example, the controller 110 may operate the synthetic jet device 102 in contact mode for a predetermined number of cycles (e.g., the diaphragm is oscillated at the first amplitude $A_1$ such that the each conductor layer 204 contacts each corresponding dielectric film layer 206 once) and record a time that corresponds to that contact. The time may be, for example, recorded in the memory of the controller 110. Following the operation in contact mode, the controller 110 may operate the synthetic jet device 102 in non-contact mode until a predetermined period of time has passed. The predetermined period of time may be, by way of example and not limitation, 3 hours, 6 hours, 12 hours, 18 hours, 24 hours, 36 hours, or even 48 hours. When the predetermined amount of time has passed, the controller 110 may operate the synthetic jet device 102 in contact mode and record the time that a new contact between the conductor layer 204 and the dielectric film layer 206 occurs.

In various embodiments, the operation of the synthetic jet device 102 in non-contact mode enables the synthetic jet device 102 to produce fluid jets while energy produced as a result of the triboelectric effect and electrostatic induction is harvested without adversely impacting the cooling system 100, and the synthetic jet device 102, in particular. Accordingly, by programming the controller 110 to operate the synthetic jet device 102 in a contact mode and a non-contact mode, device durability can be improved because of the lack of contact between the dielectric film layer 206 and the conductor layer 24 during non-contact operation.

Figure 5:
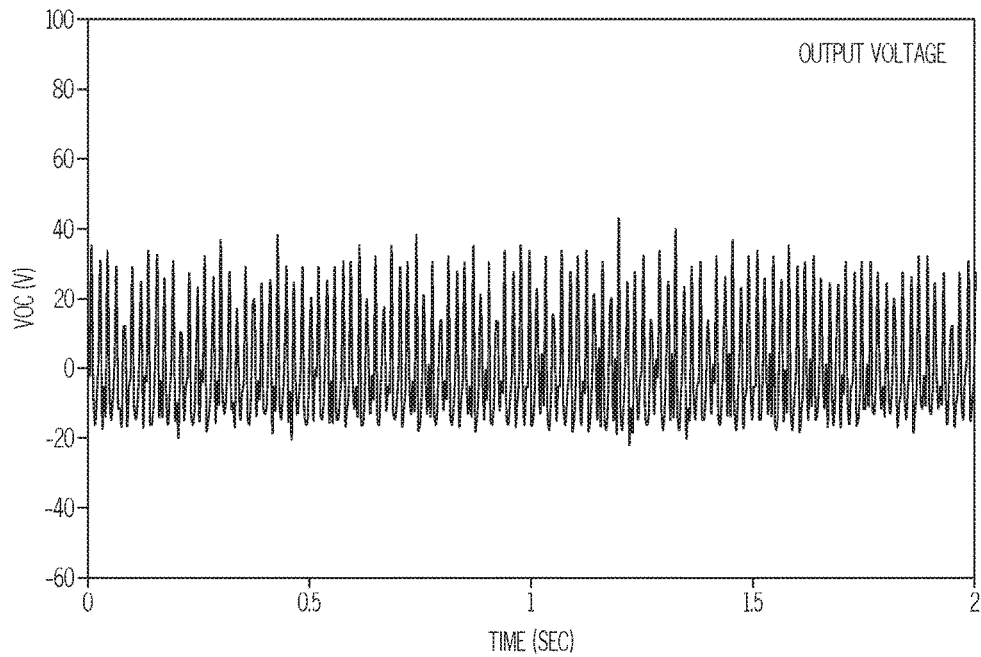
FIG. 5 is a graph illustrating the open-circuit voltage ($V_{OC}$) output of the triboelectric device according to one or more embodiments described and illustrated herein.
Figure 6:
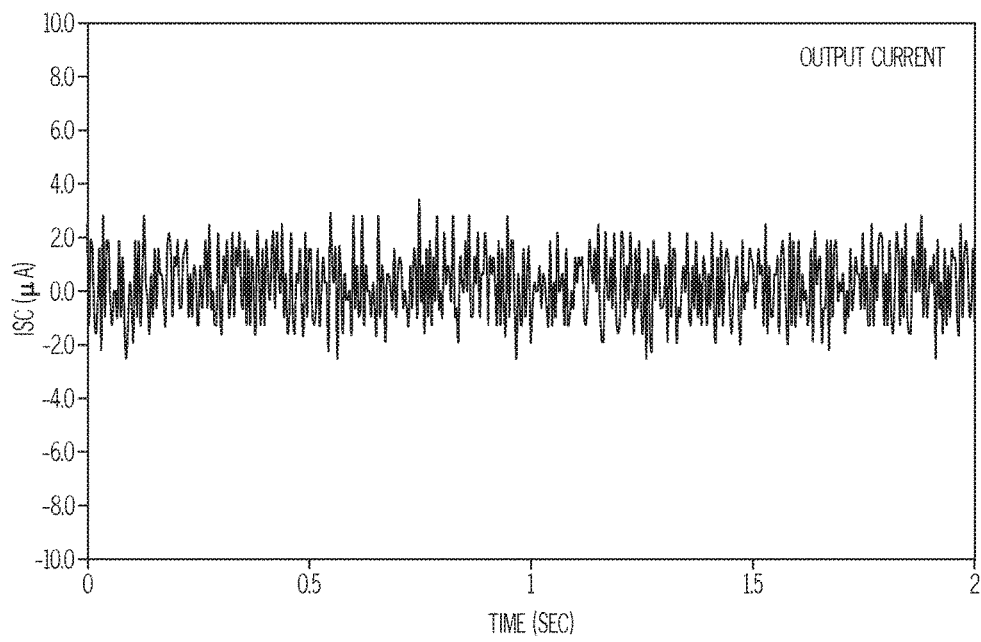
FIG. 6 is a graph illustrating the short-circuit current ($I_{SC}$) output of the triboelectric device according to one or more embodiments described and illustrated herein.

In one experimental example, a cooling system 100 included a synthetic jet device 200 in which a conductor layer 204 in the form of aluminum foil was adhered to the diaphragm and a dielectric film layer 206 in the form of fluorinate ethylene polymer was used as a contact surface with a deposited gold thin film layer as the second conductor layer 208 was adhered onto the inner surface of the upper wall 105. Conductor layer 204 and the dielectric film layer 206 were sized and aligned to have a contacting surface area of about 7 cm². FIG. 5 is a plot illustrating the open-circuit voltage ($V_{OC}$) during the operation of the device in non-contact mode. FIG. 6 is a plot illustrating the short-circuit current ($I_{SC}$) during the operation of the device in non-contact mode.

As shown in FIGS. 5 and 6, the peaks of the $V_{OC}$ and the $I_{SC}$ were up to about 40 V and about 3 μA, respectively, corresponding to a peak power density of about 0.2 W/m². In the experiment, the energy was able to simultaneously light up ten light-emitting diode (LED) bulbs continuously. Accordingly, the harvested energy may be used to power electronics devices, such as LEDs, sensors, and the like. Alternatively or in addition, the harvested energy may be used to at least partially power the cooling system 100, resulting in a self-powered cooling system.

Figure 7:
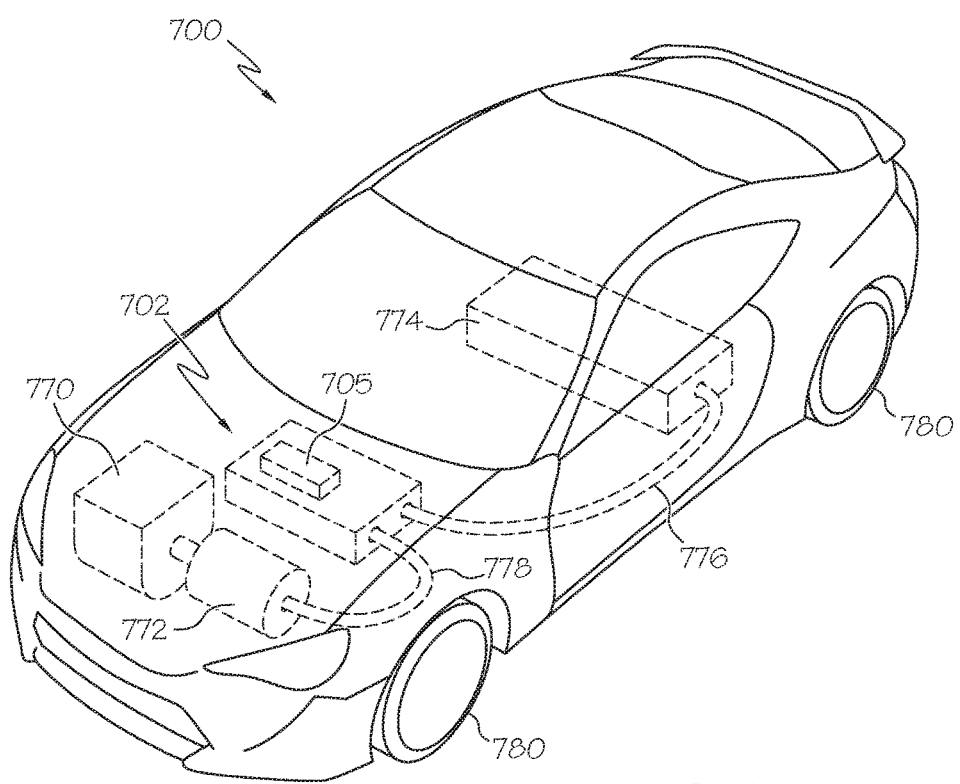
FIG. 7 schematically depicts a perspective view of a vehicle including an electric motor and a power electronics module having the cooling system according to one or more embodiments described and illustrated herein.

As stated above, the synthetic jet devices 102 described herein may be incorporated into larger power circuits, such as inverter and/or converter circuits of an electrified vehicle, for example. The electrified vehicle may be a hybrid vehicle, a plug-in electric hybrid vehicle, an electric vehicle, or any vehicle that utilizes an electric motor. Referring now to FIG. 7, a vehicle 700 configured as a hybrid vehicle or a plug-in hybrid vehicle is schematically illustrated. The vehicle generally comprises a gasoline engine 770 and an electric motor 772, both of which are configured to provide rotational movement to the wheels 780 of the vehicle 700 to propel the vehicle 700 down the road. A power circuit 702 is electrically coupled to electric motor 772 (e.g., by conductors 778). The power circuit 702 may be configured as an inverter and/or a converter circuit that provides electrical power to the electric motor 772. The power circuit 702 may in turn be electrically coupled to a power source, such as a battery pack 774 (e.g., by conductors 776). The power circuit 702 includes one or more cooling systems 100 (see FIG. 1) that include one or more triboelectric devices 200. When the synthetic jet devices 102 of the one or more cooling systems 100 operate, electricity may be harvested and stored or used by one or more components in the vehicle 700, such as sensors, LEDs, or other electronic power devices.

It should now be understood that embodiments of the present disclosure are directed to cooling systems employing synthetic jet devices from which energy may be harvested. A controller is used to operate the synthetic jet device in a contact mode and a non-contact mode to improve durability of the synthetic jet device. During operation in contact mode, a diaphragm of the synthetic jet device is oscillated at an amplitude such that a conductor layer coupled to the diaphragm contacts a dielectric film layer within the synthetic jet device to generate a charge imbalance. During operation in non-contact mode, the diaphragm is oscillated at a second amplitude such that the conductor layer and the dielectric film layer do not contact one another. Although the conductor layer and the dielectric film layer do not contact one another, the charge imbalance generated during operation in contact mode is sufficient to generate electricity as the two are brought close to one another.

It is noted that the term "approximately" may be utilized herein to represent the inherent degree of uncertainty that may be attributed to any quantitative comparison, value, measurement, or other representation. Such terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A cooling system comprising:
   a diaphragm;
   at least one conductor layer disposed on the diaphragm;
   at least one dielectric film layer; and
   a controller programmed to:
      operate the cooling system in a contact mode, wherein the diaphragm is controlled to oscillate at a first amplitude such that the at least one conductor layer contacts the at least one dielectric film layer, and
      operate the cooling system in a non-contact mode, wherein the diaphragm is controlled to oscillate at a second amplitude such that the at least one conductor layer does not contact the at least one dielectric film layer while the diaphragm oscillates.

2. The cooling system of claim 1, wherein the controller is programmed to operate the cooling system in the non-contact mode for more than one cycle following operation of the cooling system in the contact mode for a predetermined number of cycles.

3. The cooling system of claim 1, wherein the controller is programmed to operate the cooling system in the contact mode effective to increase an existing charge imbalance between the at least one conductor layer and the at least one dielectric film layer to an initial charge imbalance.

4. The cooling system of claim 3, wherein the controller is programmed to operate the cooling system in the contact mode responsive to determining that the existing charge imbalance between the at least one conductor layer and the at least one dielectric film layer is below about 50% of the initial charge imbalance.

5. The cooling system of claim 1, wherein the cooling system generates energy used to power the cooling system.

6. The cooling system of claim 1, wherein the second amplitude is less than the first amplitude and greater than 0 mm.

7. The cooling system of claim 1, wherein the at least one dielectric layer comprises fluorinated ethylene polymer.

8. The cooling system of claim 1, wherein the at least one conductor layer comprises a thin film of gold, copper, or aluminum.

9. A synthetic jet device comprising:
a diaphragm;
at least one conductor layer disposed on the diaphragm;
at least one dielectric film layer; and
a controller programmed to:
operate the synthetic jet device in a contact mode, wherein the diaphragm is controlled to oscillate at a first amplitude such that the at least one conductor layer contacts the at least one dielectric film layer, and
operate the synthetic jet device in a non-contact mode, wherein the diaphragm is controlled to oscillate at a second amplitude such that the at least one conductor layer does not contact the at least one dielectric film layer while the diaphragm oscillates;
wherein the oscillation of the diaphragm generates a fluid jet.

10. The synthetic jet device of claim 9, wherein the at least one dielectric film layer comprises one or more polymeric materials.

11. The synthetic jet device of claim 10, wherein the one or more polymeric materials comprise fluorinated ethylene polymer.

12. The synthetic jet device of claim 9, wherein the at least one conductor layer comprises a thin film of gold, copper, or aluminum.

13. The synthetic jet device of claim 9, wherein the controller is programmed to operate the synthetic jet device in the non-contact mode for more than one cycle following operation of the synthetic jet device in the contact mode for a predetermined number of cycles.

14. The synthetic jet device of claim 9, wherein the controller is programmed to operate the synthetic jet device in the contact mode effective to increase an existing charge imbalance between the at least one conductor layer and the at least one dielectric film layer to an initial charge imbalance.

15. The synthetic jet device of claim 14, wherein the controller is programmed to operate a synthetic jet device in the contact mode responsive to determining that the existing charge imbalance between the at least one conductor layer and the at least one dielectric film layer is below about 50% of the initial charge imbalance.

16. The synthetic jet device of claim 9, wherein the synthetic jet device generates energy in an amount between about 0.1 $W/m^2$ and about 1.9 $W/m^2$ when operated in non-contact mode.

17. The synthetic jet device of claim 7, wherein the second amplitude is less than the first amplitude and greater than 0 mm.

18. A vehicle comprising:
an electric motor; and
a synthetic jet device electrically coupled to the electric motor, the synthetic jet device comprising:
a diaphragm;
at least one conductor layer disposed on the diaphragm;
at least one dielectric film layer; and
a controller programmed to:
operate the synthetic jet device in a contact mode, wherein the diaphragm is controlled to oscillate at a first amplitude such that the at least one conductor layer contacts the at least one dielectric film layer, and
operate the synthetic jet device in a non-contact mode, wherein the diaphragm is controlled to oscillate at a second amplitude such that the at least one conductor layer does not contact the at least one dielectric film layer while the diaphragm oscillates.

19. The vehicle of claim 18, wherein the controller is programmed to operate the synthetic jet device in the contact mode responsive to determining that an existing charge imbalance between the at least one conductor layer and the at least one dielectric film layer is below about 50% of an initial charge imbalance.

20. The vehicle of claim 18, wherein the synthetic jet device is at least partially powered by electricity produced by the oscillation of the diaphragm.

* * * * *